US011755507B2

(12) United States Patent
Zheng et al.

(10) Patent No.: US 11,755,507 B2
(45) Date of Patent: *Sep. 12, 2023

(54) MEMORY MODULE THREADING WITH STAGGERED DATA TRANSFERS

(71) Applicant: Rambus Inc., San Jose, CA (US)

(72) Inventors: Hongzhong Zheng, Sunnyvale, CA (US); Frederick A Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/744,331

(22) Filed: May 13, 2022

(65) Prior Publication Data

US 2022/0342834 A1    Oct. 27, 2022

Related U.S. Application Data

(63) Continuation of application No. 16/914,221, filed on Jun. 26, 2020, now Pat. No. 11,347,665, which is a continuation of application No. 16/365,528, filed on Mar. 26, 2019, now Pat. No. 10,705,988, which is a continuation of application No. 15/428,121, filed on Feb. 8, 2017, now Pat. No. 10,268,607, which is a
(Continued)

(51) Int. Cl.
*G06F 13/40*    (2006.01)
*G06F 13/16*    (2006.01)
(Continued)

(52) U.S. Cl.
CPC ........ *G06F 13/1673* (2013.01); *G06F 9/4881* (2013.01); *G06F 13/1678* (2013.01);
(Continued)

(58) Field of Classification Search
CPC ........... G06F 13/40; G06F 13/16; H04L 47/50
See application file for complete search history.

(56) References Cited

U.S. PATENT DOCUMENTS

| 8,028,144 B2 | 9/2011 | Hampel et al. |
| 2005/0144375 A1* | 6/2005 | Bains .................... G06F 13/161 |
| | | 711/167 |

(Continued)

OTHER PUBLICATIONS

Kim, Yoongu et al., "Thread Cluster Memory Scheduling: Exploiting Differences in Memory Access Behavior," 2010 43rd Annual IEEE/ACM International Symposium on Microarchitecture (MICRO), pp. 65-76, Dec. 4-8, 2010. 12 pages.

*Primary Examiner* — David E Martinez
(74) *Attorney, Agent, or Firm* — Lance Kreisman; Peninsula Patent Group

(57) ABSTRACT

A method of transferring data between a memory controller and at least one memory module via a primary data bus having a primary data bus width is disclosed. The method includes accessing a first one of a memory device group via a corresponding data bus path in response to a threaded memory request from the memory controller. The accessing results in data groups collectively forming a first data thread transferred across a corresponding secondary data bus path. Transfer of the first data thread across the primary data bus width is carried out over a first time interval, while using less than the primary data transfer continuous throughput during that first time interval. During the first time interval, at least one data group from a second data thread is transferred on the primary data bus.

20 Claims, 11 Drawing Sheets

Related U.S. Application Data continuation of application No. 13/963,391, filed on Aug. 9, 2013, now Pat. No. 9,569,393.

(60) Provisional application No. 61/681,889, filed on Aug. 10, 2012.

(51) Int. Cl.
| | |
|---|---|
| *H04L 12/863* | (2013.01) |
| *G06F 9/48* | (2006.01) |
| *G11C 11/4076* | (2006.01) |
| *G11C 11/4094* | (2006.01) |

(52) U.S. Cl.
CPC ...... *G06F 13/4059* (2013.01); *G11C 11/4076* (2013.01); *G11C 11/4094* (2013.01); *G06F 2209/486* (2013.01); *G06F 2209/5018* (2013.01)

(56) References Cited

U.S. PATENT DOCUMENTS

| | | |
|---|---|---|
| 2007/0260841 A1* | 11/2007 | Hampel ............. G06F 13/1642 |
| | | 711/167 |
| 2008/0320254 A1 | 12/2008 | Wingard et al. |
| 2009/0217273 A1 | 8/2009 | Mutlu et al. |
| 2009/0248994 A1 | 10/2009 | Zheng et al. |
| 2011/0016278 A1 | 1/2011 | Ware et al. |
| 2011/0099341 A1 | 4/2011 | Resnick |
| 2011/0179240 A1 | 7/2011 | Sukonik et al. |
| 2011/0276972 A1 | 11/2011 | Chung et al. |
| 2011/0302586 A1 | 12/2011 | Chung |
| 2015/0089164 A1 | 3/2015 | Ware et al. |

\* cited by examiner

MEMORY MODULE THREADING WITH STAGGERED DATA TRANSFERS

RELATED APPLICATIONS

This application is a Continuation of U.S. application Ser. No. 16/914,221, filed Jun. 26, 2020, entitled MEMORY MODULE THREADING WITH STAGGERED DATA TRANSFERS, which is a Continuation of U.S. application Ser. No. 16/365,528, filed Mar. 26, 2019, entitled MEMORY MODULE THREADING WITH STAGGERED DATA TRANSFERS, now U.S. Pat. No. 10,268,607, which is a Continuation of U.S. application Ser. No. 15/428,121, filed Feb. 8, 2017, entitled MEMORY MODULE THREADING WITH STAGGERED DATA TRANSFERS, now U.S. Pat. No. 10,268,607, which is a Continuation of U.S. application Ser. No. 13/963,391, filed Aug. 9, 2013, entitled MEMORY MODULE THREADING WITH STAGGERED DATA TRANSFERS, now U.S. Pat. No. 9,569,393, which claims the benefit of priority under 35 U.S.C. 119(e) to Provisional Application No. 61/681,889, filed Aug. 10, 2012, entitled MEMORY MODULE THREADING WITH STAGGERED DATA TRANSFERS, all of which are incorporated by reference in their entirety for all purposes.

The disclosure herein relates to high-speed memory system architectures and associated methods.

BACKGROUND

Memory system performance plays an important role in the overall performance of a computer processing system. One proposed memory system architecture varies memory module data transfer granularity by partitioning a memory module into independent portions called data threads. Each data thread transfers data in response to thread-specific commands to provide a threaded data transfer granularity that is finer than an aggregate data transfer granularity of the module (typically 64 Bytes). One variant of the proposed module threading architecture employs a buffer circuit on each memory module to buffer the memory devices on the module from a primary data bus coupled to a memory controller. As a single electrical load, the buffer architecture allows for greater memory capacity along the primary bus without corresponding parasitic loading of the primary bus.

Although threaded buffered modules provide signal integrity benefits by minimizing loading on the primary data bus, the buffer circuitry generally introduces additional read latency. For computing systems that employ "critical word first" policies, where a processor can restart without waiting for a full block of data to be loaded, read latency can have a significant impact on processor wait times.

Thus, the need exists for read latency improvements in buffered modules that employ module threading.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Figure 1:
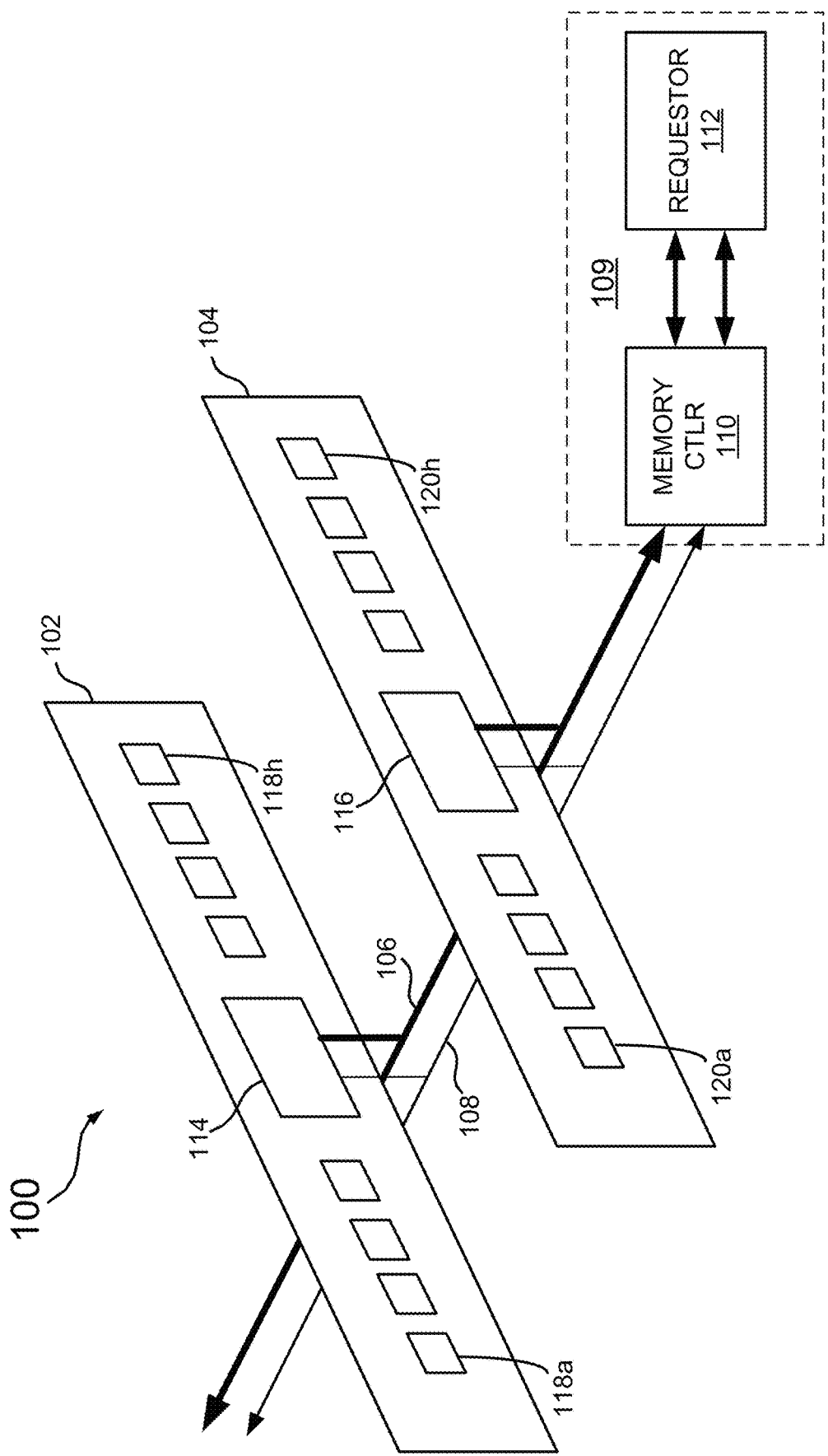
FIG. 1 illustrates a memory system having multiple memory modules and a memory control circuit.

Embodiments of a method of transferring data between a memory controller and at least one memory module via a primary data bus are disclosed. The primary data bus routes data of a primary data transfer granularity between the module and the controller. The memory module includes plural memory devices coupled to a buffer via corresponding secondary data bus paths. The method includes accessing a set of the plural devices via a corresponding set of the secondary data bus paths in response to a threaded memory request from the memory controller. The accessing results in groups of data collectively forming a data thread. Transfers of the groups of data associated with the threaded memory request via the primary data bus are staggered in a non-contiguous manner. Each data thread has a data transfer granularity finer than the primary data transfer granularity, and includes the smallest collection of data responsive to a given memory access request. Viewed another way, the secondary data bus paths each have a lower continuous throughput or bandwidth than the primary data bus continuous throughput or bandwidth. Multiple data threads thus share the bandwidth of the primary data bus, with staggering used to improve at least the latency of the first data group of each data thread. Continuous throughput measures the data transferred by a bus, e.g., in bits, as measured over a time period when data is transmitted without interruption.

In another embodiment, a memory is disclosed including hub circuitry for coupling to a primary data bus. The primary data bus routes data of a primary data transfer granularity. Plural memory devices are coupled to the hub circuitry via respective secondary data bus paths. The plural memory devices are organized into groups, where each group is responsive to a memory request to transfer a data thread. Each data thread has a data transfer granularity finer than the primary data transfer granularity. Control circuitry controls staggered transfers of portions of the data threads in a non-contiguous manner.

In a further embodiment, a method of reading data is disclosed. The method includes generating a first burst of read data responsive to a first thread request in a first clock cycle. A second burst of read data responsive to a second thread request is generated in a second clock cycle. The first and second bursts of read data are aggregated in a non-contiguous manner across a parallel interface. The read data is then transferred from the parallel interface across a primary data bus to a memory controller.

In another embodiment, a method of operation in a memory controller is disclosed. The method includes receiving data requests from a requestor and queuing the received requests in a per-thread manner. A given thread corresponds to the finest data transfer granularity of data retrievable from a buffered memory in response to a memory request. The thread requests are prioritized in accordance with a predetermined scheduling policy. The prioritized threaded memory requests are then scheduled for read data transfers from the buffered memory along a primary data bus such that the read data transfers are scheduled to interleave read data bursts from different threads in a non-contiguous manner.

In yet another embodiment, a memory controller is disclosed. The memory controller includes request logic to receive memory requests from a requestor and a plurality of request queues. The plurality of request queues corresponds to a plurality of data threads. Each request queue temporarily stores incoming data thread requests. Each data thread comprises data of a data transfer granularity finer than a primary data transfer granularity exhibited by a primary data bus, where each data thread comprises the smallest collection of data responsive to a given memory access request. A threads group scheduler generates data thread memory commands for transmission to a plurality of memory devices via a buffer.

In a further embodiment, a buffer circuit is disclosed. The buffer circuit includes a command interface to receive scheduled memory access commands from a memory controller and a primary data bus interface for coupling to a memory controller. The primary data bus transfers data of a first granularity between the buffer circuit and the memory controller. A secondary data bus interface couples to a plurality of secondary buses. The secondary buses transfer data between the buffer circuit and a plurality of memory devices, and are grouped into data threads to transfer data of a granularity finer than the first granularity. Distribution logic time-staggers portions of data thread transfers between the memory devices and the memory controller.

Referring now to FIG. 1, one embodiment of a buffered memory architecture, generally designated 100, employs multiple memory modules 102 and 104 coupled to a primary data bus 106 and command bus 108. Memory control circuitry 109 in the form of a memory controller 110 and a requestor 112 are also coupled to the primary data bus and command bus to direct data transfers between the modules and the control circuitry. The control circuitry may include, e.g., a discrete memory controller separate from a requestor integrated circuit (IC), or a processor IC that includes an on-chip memory controller.

Further referring to FIG. 1, the embodiment shown illustrates a multi-drop bus, where the primary data bus 106 is shared by all of the modules 102 and 104. Point-to-point topologies are also envisioned, but not illustrated. The modules include respective buffer circuits 114 and 116 and memory devices 118a-118h and 120a-120h. The buffer circuits isolate the memory devices from the primary data bus and command bus for each module. Thus, instead of the multiple memory devices for each module loading the bus, only the buffer circuit loads the bus. This minimizes capacitive loading on the shared primary data bus, among other things.

Figure 2:
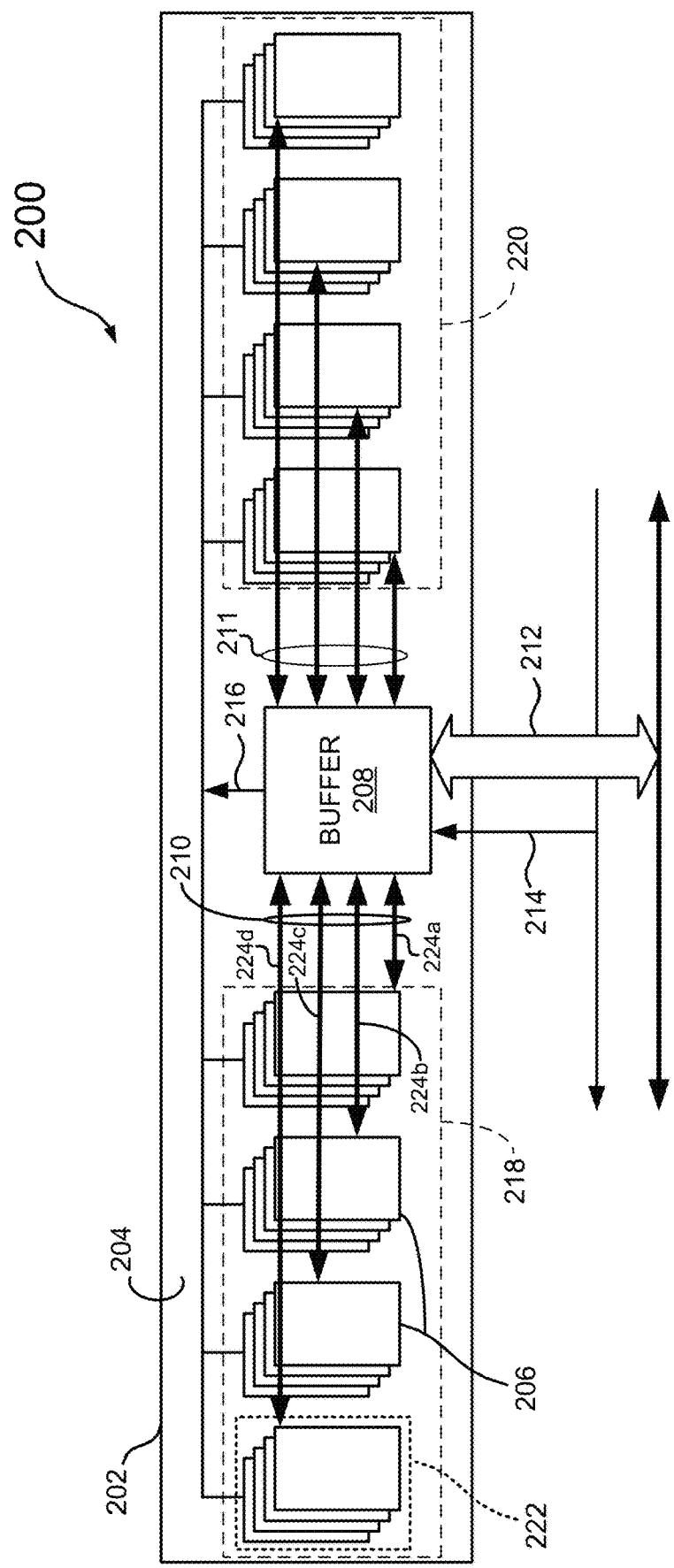
FIG. 2 illustrates further detail of one embodiment of a memory module for use in the system of FIG. 1.

FIG. 2 illustrates additional detail for one embodiment of a memory module, generally designated 200, that corresponds to the memory modules 102 and 104 of FIG. 1. Each module 200 includes a substrate 202 having a front face 204 that mounts a plurality of memory devices 206 organized as a "rank". The memory devices are coupled to a buffer chip 208 via secondary data bus paths 210 and 211. The buffer chip, in turn, interfaces with a primary data bus 212 and primary command bus 214. A secondary command bus 216 routes command signals from the buffer chip to the memory devices. Typically, a rank corresponds to a set of separately addressable memory devices used for a single memory access. Sub-ranks, or "threads", as more fully described below, further refine the module organization to allow smaller sets of data, termed "data threads" to be accessed. In some embodiments, an additional set of memory devices are mounted on the back face of the module, and organized as a second rank. Various ways to optionally access data associated with one or more ranks and threads are described below.

As noted above, in an effort to implement finer data transfer granularity for applications that benefit from smaller data transfers, the ranks may be sub-grouped into "threads", such as 218 and 220. Each thread is generally organized as a subset of a given rank that includes a group of memory devices that are responsive to a given threaded memory request. The threads may be activated by associating additional command resources such as "chip selects" to, for example, enable only a portion of the rank of chips to respond to the request.

The responsive data to the thread request, a "data thread", generally has a data transfer granularity finer than the primary data transfer granularity associated with the primary data bus 212. "Granularity" refers to the collection of data transferred in response to a given read or write command— "fine granularity" allows access to relatively smaller collections of data per command, and relatively "coarse granularity" allows access to relatively larger collections of data per command. For conventional high-speed memory architectures, a typical data transfer granularity is 64 bytes, corresponding to eight sequential transfers of 64-bit bursts of parallel data transferred in response to a read or write command. In one embodiment, where a given single-rank module is partitioned into two threads, such as that shown in FIG. 2, each data thread has a data transfer granularity of 32 Bytes.

As more fully described below, and to minimize read latency, data transfers involving data threads are carried out in a staggered manner, such that portions of data threads that are available for transfer are transmitted without necessarily waiting for an entire data thread to be aggregated before transfer. The staggering may be carried out temporally or spatially. From a memory controller scheduling perspective, staggering relates to a threaded memory request where data associated with the memory request is transmitted across multiple memory cycles. However, the data is transmitted across the primary data bus at both temporally contiguous memory cycle times and across a common subset of the primary data bus lanes for all cycle times. Having this capability may allow the memory controller to have greater scheduling flexibility to, for example, retrieve a critical word for a requestor faster than could be accomplished using a non-staggered approach.

Further referring to FIG. 2, the memory devices in each thread may include one or more DRAM memory device groups 222 that are stacked or otherwise disposed in a single IC package or through stacked IC packages. The device groups interface with the buffer chip 208 via dedicated secondary data bus paths 224a-224d. Thus, for an embodiment where a given thread has a 32 bit wide interface, and four groups of memory devices, each secondary data path is 8 bits wide.

With continued reference to FIG. 2, the memory device groups 222 are responsive to commands transmitted on the secondary command bus 216 driven by the buffer circuit 208. The secondary command bus routes various command and address signals from the buffer circuit in a threaded manner, scheduled by the memory controller through a threads-group method described more fully below to effect the noted staggered data transfers along the primary data bus 212.

Figure 3:
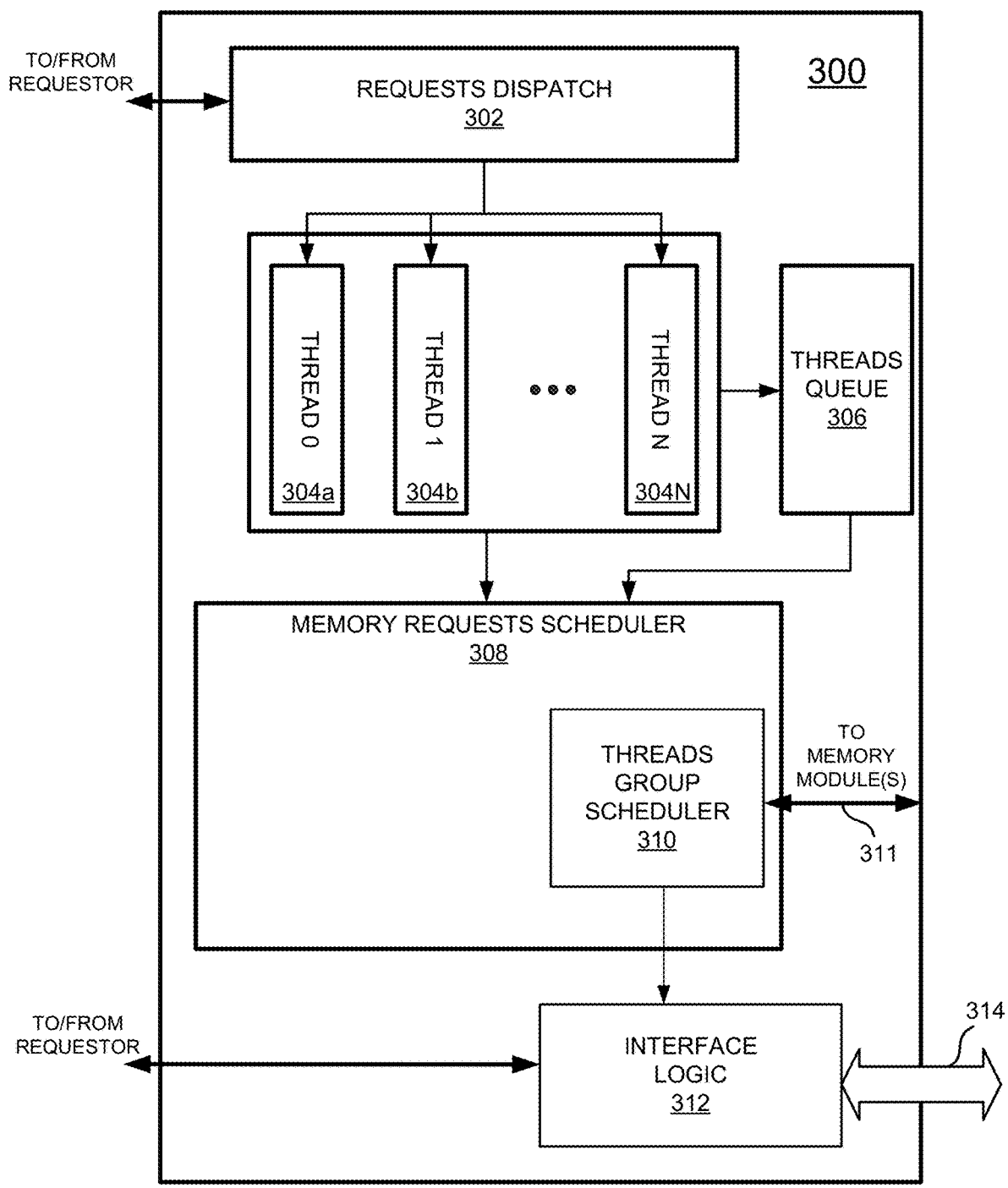
FIG. 3 illustrates one embodiment of a memory controller for use in the system of FIG. 1.

Referring now to FIG. 3, one embodiment of a memory controller, generally designated 300, is illustrated that corresponds to the memory controller 110 of FIG. 1. The controller includes a requests dispatch circuit 302 that interfaces with a set of request queues 304a-304n that correspond to the memory module(s) threads. Generally, the request dispatch circuit receives read and/or write data requests from the requestor, such as a processor, and distributes the requests among the request queues. Each of the request queues maintains a prioritized list of requests, and in the case of writes, may also temporarily store the data associated with the request. In one embodiment, a threads queue 306 interacts with the request queues to sort the first requests in each request queue according to a predetermined policy, such as a First-Come-First-Serve, Read-First, Hit-First, and the like. Other policies may be observed depending on the application, such as prioritization based on command addresses, threads, bank conflicts, request age, etc.

Further referring to FIG. 3, the request queues 304a-304N and the sorted threads queue 306 feed data requests in the form of reads or writes to a memory request scheduler 308. The scheduler converts the request information into suitable DRAM command sets for placement into an appropriate command queue awaiting availability of the corresponding DRAM device(s) on the module. The command sets provide the request information in a manner suitable for interfacing with the DRAMs. Thus, typical command sets may involve channel number, thread number, chip selects, rank number, bank/row and column addresses, and explicit commands such as PRE (precharge), ACT (activate, row access), RD (column read), and WR (column write). Suitable delays are provided, as appropriate, to take into account the read latency of the data transactions from the time a given request is initiated, to the time read data is received at the controller.

In one embodiment, and still referring to FIG. 3, a threads group scheduler 310 associated with the requests scheduler provides finer control over the command queue scheduling. In one embodiment, the threads group scheduler configures command scheduling for command and control information over the primary command bus, here represented by 311, such that read data bursts corresponding to respective data threads are transferred along the primary data bus as they are received by the buffer circuit. Writes are handled in a similar, but opposite manner. Thus, a given burst for a given data thread does not wait for all of the related bursts of the same data thread before being transferred with the entire data thread, as is done in legacy systems. By immediately transferring bursts from the different data threads, portions of each data thread become staggered during data transfers between the buffer circuit and the primary data bus. The staggering approach described above is particularly useful for cache protocols that utilize a critical word first miss line because the memory controller can schedule access to the critical piece of data, and retrieve it for the requestor in a faster way. In this manner, particularly for read data applications, read data latency can be reduced.

With continued reference to FIG. 3, the memory controller includes interface logic 312 that includes receiver logic to process read data received from the buffer via the primary data bus, here represented by 314. The receiver logic includes circuitry to de-interleave the data threads, and provide the critical data portions to the requestor as the portions are received.

Figure 4:
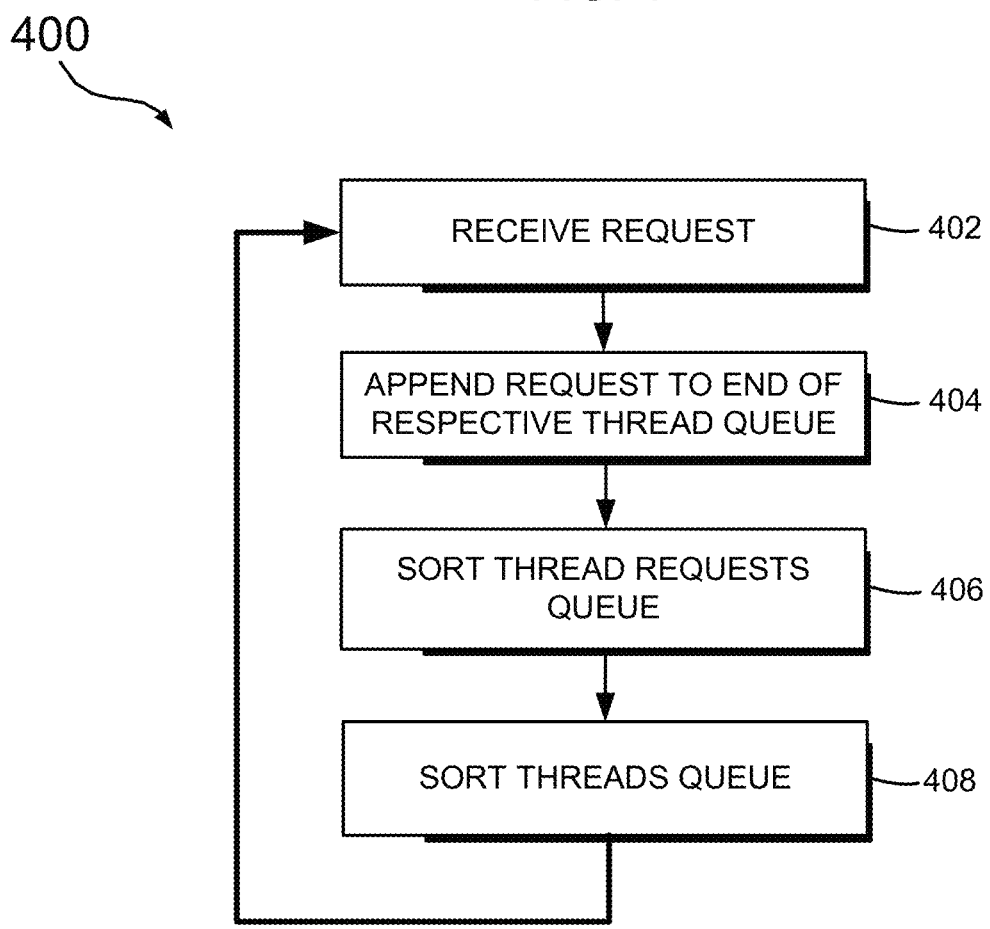
FIG. 4 illustrates a flowchart stepping through a memory request acceptance flow.
Figure 5:
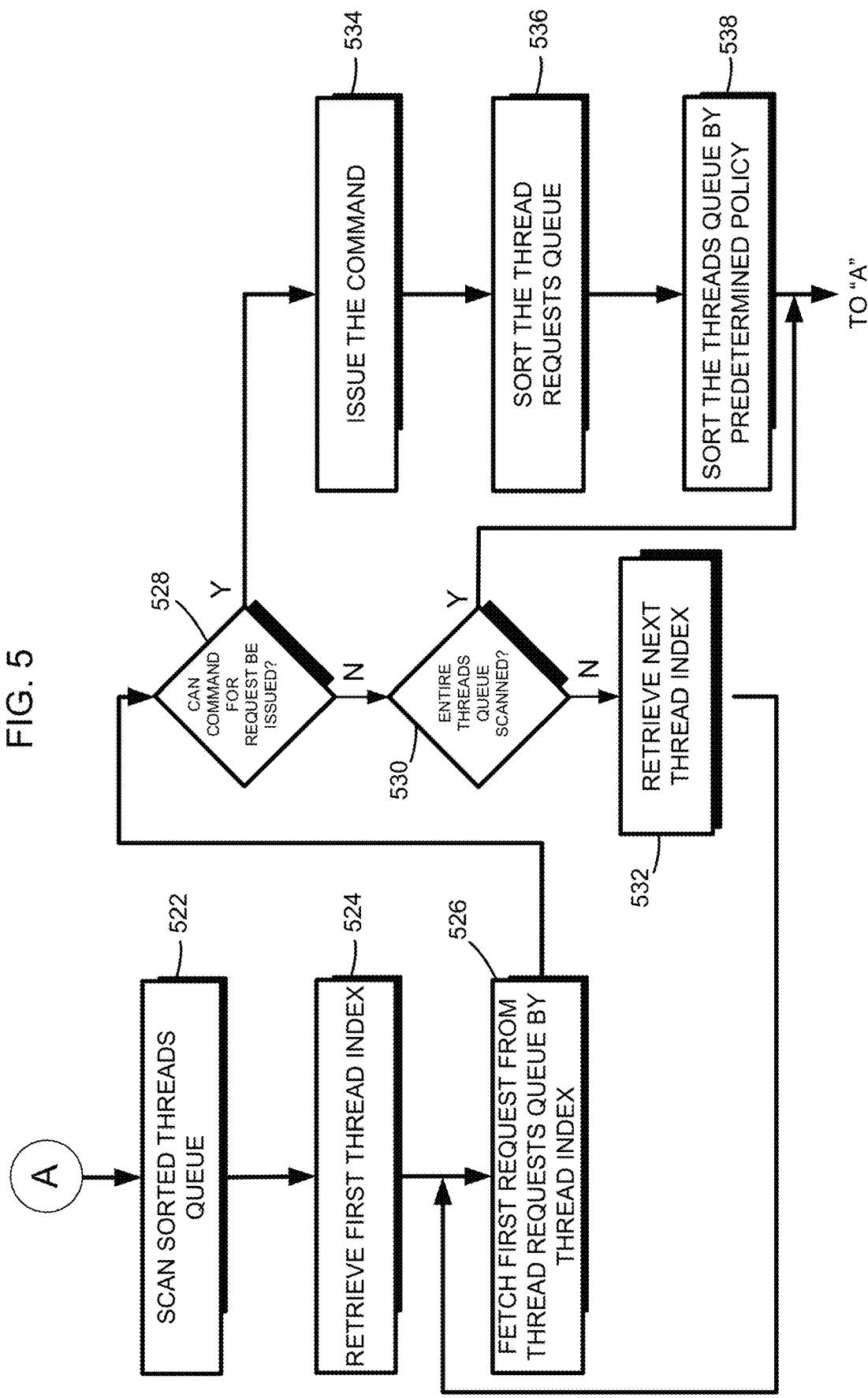
FIG. 5 illustrates a flowchart of steps performed in one embodiment of a memory request scheduling flow.

The operation of the memory controller 300 of FIG. 3 is generally set forth in the flowcharts exhibited in FIGS. 4 and 5. In one embodiment, and referring to FIG. 4, a memory request acceptance flow involves first receiving requests from the requestor, at step 402. In a situation where the requestor is a processor interacting with cache memory in accordance with a "critical word first" policy, the request may involve a read transaction for data from the memory system that was previously read, placed in a processor cache, and "missed". Access to that missed data is of a higher priority in order to optimize processor (requestor) operation. Once received, the request is appended to the end of one or more thread queues, at step 404. The thread requests queue is then sorted, at step 406, depending on the policy being employed. As explained above, the policy may be of the type consistent with a First-Come-First-Serve scheme, a Read-First scheme and/or a Hit-First approach. The threads queue is then sorted, at step 408, in a similar manner, and the steps from 402-408 repeated for each new request.

In terms of scheduling, FIG. 5 illustrates steps involved in one embodiment of the memory requests scheduling flow. The flow begins by scanning the first request of the sorted threads queue, at step 522. From the scanning, a first thread index is retrieved, at step 524. The index indicates the order to fetch the requests, acting as a pointer. At step 526, a first request is fetched from the thread requests queue based on the thread index. The scheduler then determines whether a command set for the request can be issued, at step 528.

Further referring to FIG. 5, if a command set can be issued for the fetched request, then the command is issued, at step 534. The thread requests queue is then re-sorted based on the prioritization policy, at step 536, along with the threads queue, at step 538. Following both sorting operations, the process begins again (via bubble "A") with a scan of the sorted threads queue in the next memory cycle, at step 522.

If a command set cannot be issued, at step 528, a further determination is made regarding whether the entire threads queue has been scanned, at step 530. If not, then the next thread index is retrieved, at step 532, with the process returning to the fetching of a subsequent request from the thread request queue by the index, at step 526. If the scanning determination of step 530 indicates that the entire threads queue has been scanned, then the process returns to scanning the sorted threads queue in the next memory cycle, at step 522 (via bubble "A").

Figure 6:
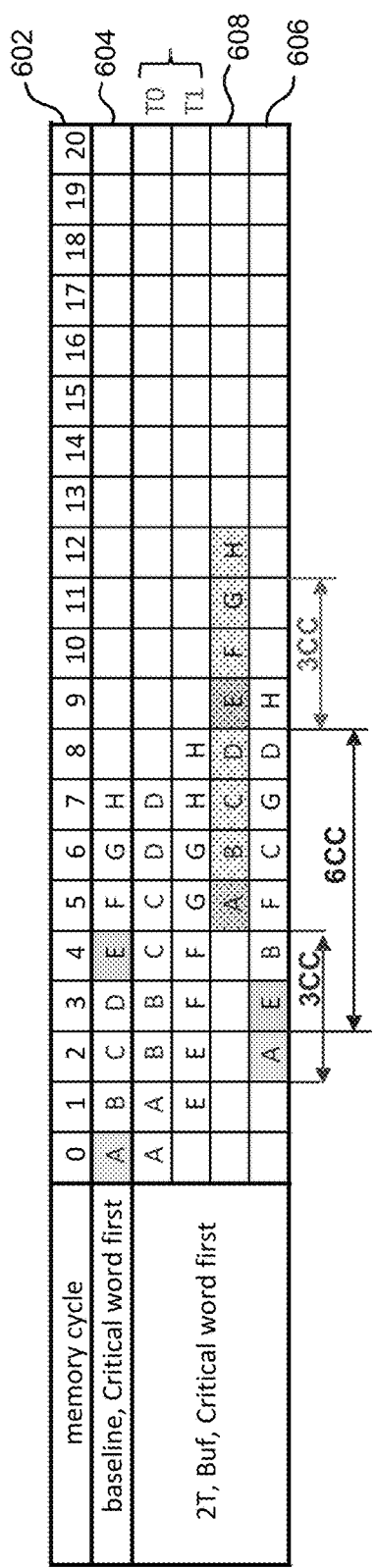
FIG. 6 illustrates a timing chart for read data transfers involving single-rank, dual threaded memory modules.

FIG. 6 illustrates a timing chart showing one embodiment of the staggered nature of an exemplary read data transfer of 64 Bytes from a threaded memory module having two threads. The top row of the chart, at 602, represents a timeline in terms of memory clock cycles, going from left to right. The second row, at 604, identifies eight groups of 64-bit bursts that would be scheduled for transfer as read data from the memory devices to the memory controller for a configuration without any module threading. The first four groups of data A, B, C, and D relate to the data to be transferred responsive to a first thread request, while data groups E, F, G and H represent data to be transferred responsive to a second thread request. It is important to remember that the memory controller initiates and tracks the various thread requests, including the timing of the requests.

With continued reference to FIG. 6, during cycles 0 and 1, a first data group "A" is sent from a first group of the memory devices in a thread T0 to the buffer circuit over a secondary data bus. One cycle later, during cycles 1 and 2, a second data group "E" is sent from a second group of memory devices associated with a second thread T1 to the buffer circuit over a different secondary data bus.

Further referring to FIG. 6, at cycles 2 and 3, thread 0 transfers the second data group ("B") for the data thread (thread T0) responsive to the first thread request. Also, at cycle 2, the data associated with the first data group "A" of thread 0 is placed on the entire width of the primary data bus (row 606) by the buffer circuit. One cycle later, at cycle 3, the first data group "E" from thread 1 is placed on the entire width of the primary data bus (row 606) by the buffer circuit. For each additional cycle, the next data group for each thread is alternatingly placed on the entire width of the primary data bus by the buffer until all eight bytes of the thread requests have been transferred in an interleaved non-contiguous manner along the primary data bus, as shown in row 6, at 606, of FIG. 6. The result is a data transfer that has bursts transmitted across the width of the primary bus from a common thread that are temporally staggered in a non-contiguous manner. In this particular embodiment, the staggering is realized as an interleaving of the bursts from one thread with bursts from another thread.

FIG. 6 also illustrates, in row 5, at 608, a legacy manner in which data threads are transferred. Generally, the first data group of a first data thread is not transmitted on the primary data bus until the entire data thread can be transferred in a contiguous burst across the primary data bus without data starvation within the buffer. Thus, data group "A" cannot begin transmitting until cycle 5, three cycles later than if a staggering mode is employed. Although the first data thread can complete transmission in the same overall time, the second data thread cannot, and will be delayed. Further, the first data group of the second data thread is delayed in the legacy example by six cycles, as compared to the present embodiment.

Additional threads beyond the two threads described above may be realized with additional control resources. A module may be appropriately partitioned into additional threads FIG. 7 illustrates a timing chart for a module organized into four threads, with appropriate scheduling carried out by the memory controller to effect a staggered transfer of bursts from the respective threads responsive to multiple threaded requests.

Figure 7:
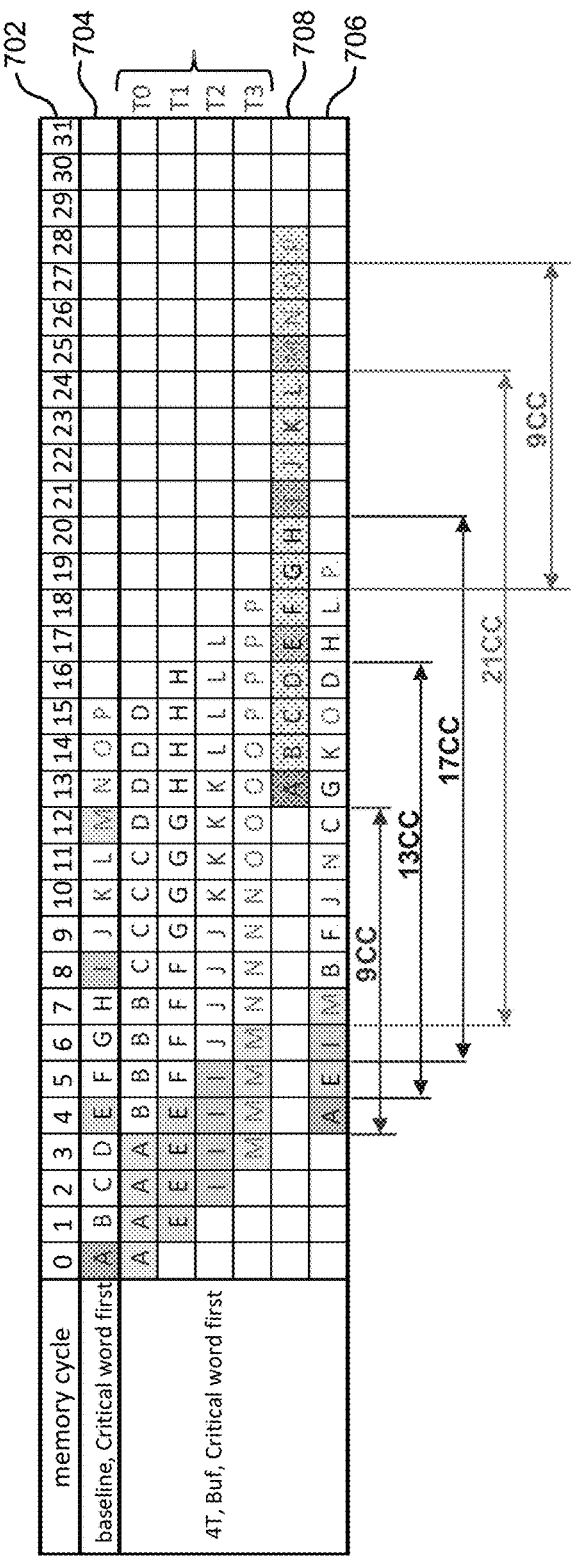
FIG. 7 illustrates a timing chart for read data transfers involving dual-rank, quad threaded memory modules.

The timing chart of FIG. 7 is similar to that of FIG. 6, with the top line at 702 representing clock cycles, and the second line at 704 representing groups of data associated with four data threads. Data groups "A", "B", "C" and "D" are associated with a first data thread T0, groups "E", "F", "G" and "H" are associated with a second data thread T1, groups "I", "J", "K" and "L" are associated with a third data thread T2, and groups "M", "N", "O" and "P" are associated with a fourth data thread T3.

Further referring to FIG. 7, the first data thread T0 transfers data group "A" as a four-cycle burst to the local buffer over a secondary data bus, beginning with cycle 0 and continuing through cycle 3. Data group "E" from thread T1 begins its four-cycle burst to the local buffer over a different secondary data bus beginning with cycle 1, with data group "I" (thread T2) beginning similarly at cycle 2, and data group "M" (thread 3) similarly at cycle 3. At cycle 4, the buffer circuit places group "A" from thread T0 on the entire width of the primary data bus (row 706). One cycle later, the buffer circuit places group "E" from thread T1 on the entire width of the primary data bus (row 706), with the first data groups from the remaining threads placed on the primary data bus in the next two cycles, after which the buffer circles back to transmit the next data group "B" from thread T0 during cycle 8. The buffer receives the data portions and packages the data into 64 Byte read data transfers to the controller along the primary data bus. The last row of FIG. 7, at 706, shows the data portions from the various threads interleaved in a non-contiguous manner to offset the staggered data thread scheduling on the primary data bus.

FIG. 7 also illustrates how legacy data thread transfers could be carried out with four threads, shown at 708. Under a legacy approach, with a first data unit from each thread being transferred at cycles 0, 4, 8 and 12, respectively, the first data group "A" is not transferred across the primary data bus until cycle 13, e.g., a time when the entire data thread "ABCD" can be transferred across the primary data bus without data starvation within the buffer. This is a nine-cycle difference in read latency for the first data group when compared with the staggered approach described above. The other first data groups "E", "I" and "M" of the other threads exhibit even longer read latencies when compared to the staggered approach (13, 17, and 21 cycles, respectively).

The embodiments described above set out one way of carrying out a staggered threads scheduling methodology by interleaving portions of a given data thread with portions of another data thread such that the data from each thread is transmitted in a temporally non-contiguous manner. Having the ability to handle the data transfers in this manner provides performance benefits for applications that, for example, employ critical word first caching schemes.

Figure 8:
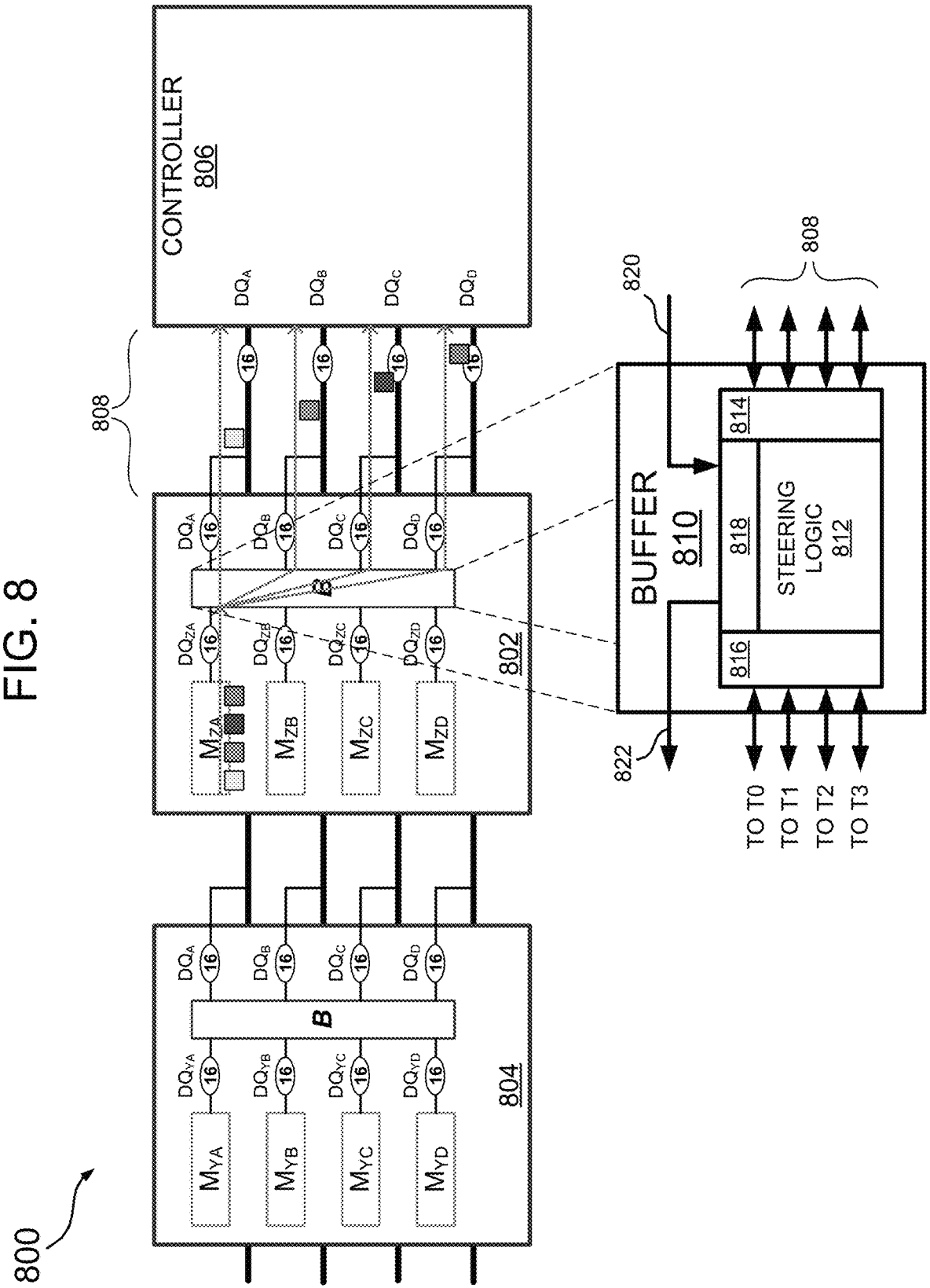
FIG. 8 illustrates a block diagram of a memory system with buffered modules and showing a data flow for one embodiment of system operation.

FIG. 8 illustrates a further embodiment of a threaded module memory architecture, generally designated 800, that employs a staggered threads scheduling method. Respective first and second modules 802 and 804 interface with a memory controller 806 via a shared primary data bus 808. The primary data bus is shown as a collection of four sets $DQ_A$-$DQ_D$ of 16 data paths, or DQs. Each set of DQs may be viewed as a "data slice." The first module 802 includes memory devices organized into four threads $M_{ZA}$-$M_{ZD}$, and a buffer circuit 810 coupled to the threads over corresponding groups of secondary data busses $DQ_{ZA}$-$DQ_{ZD}$. Similar to the previously described system embodiment, a buffer 810 isolates the threads from the primary data bus.

The memory devices for each module may be organized into one or more "ranks" that represent a collection of devices on the module responsive to a given set of memory commands. Each rank may be further sub-divided into "slices" that represent a collection of storage and secondary data path resources.

Further referring to FIG. 8, the buffer circuit 810 for the first module 802 includes steering logic 812 that includes a primary data interface 814 coupled to the primary bus 808, and a secondary data interface 816 coupled to the secondary data busses $DQ_{ZA}$-$DQ_{ZD}$. A command interface 818 receives command and control signals from the controller along a command/address path 820 and forwards corresponding command and control signals along a command path 822 to the various threads T0-T3. The buffer circuits for the subsequent modules are configured similar to that described above.

For read transactions, the steering logic 812 is configured with switching and timing circuitry to distribute respective data groups of a given data thread across respective slices of the primary data bus 808, each data group at a staggered time interval with respect to other data groups of the same thread. Thus, for an implementation involving four threads per module, when fully scheduled each thread could have a data group (such as one or more 8-bit data bursts) transferred along a different slice of the primary data bus (such as 16 DQs) at the same time interval. From the perspective of a single data thread, subsequent data groups of the thread would be staggered in time by each time interval, and transferred along a different slice of the primary data bus during those intervals. This staggered timing methodology allows the buffer to carry out threaded data burst requests scheduled and managed by the controller 806 to stagger transfers of data bursts from a given thread across slices of the primary data bus, at staggered time intervals along those slices. Further, the system of FIG. 8 does not impose additional timing constraints by the use of module threading on a secondary bus (other than a longer serialization time for each transaction). This allows the memory controller to schedule such transactions without additional constraints.

Figure 9:
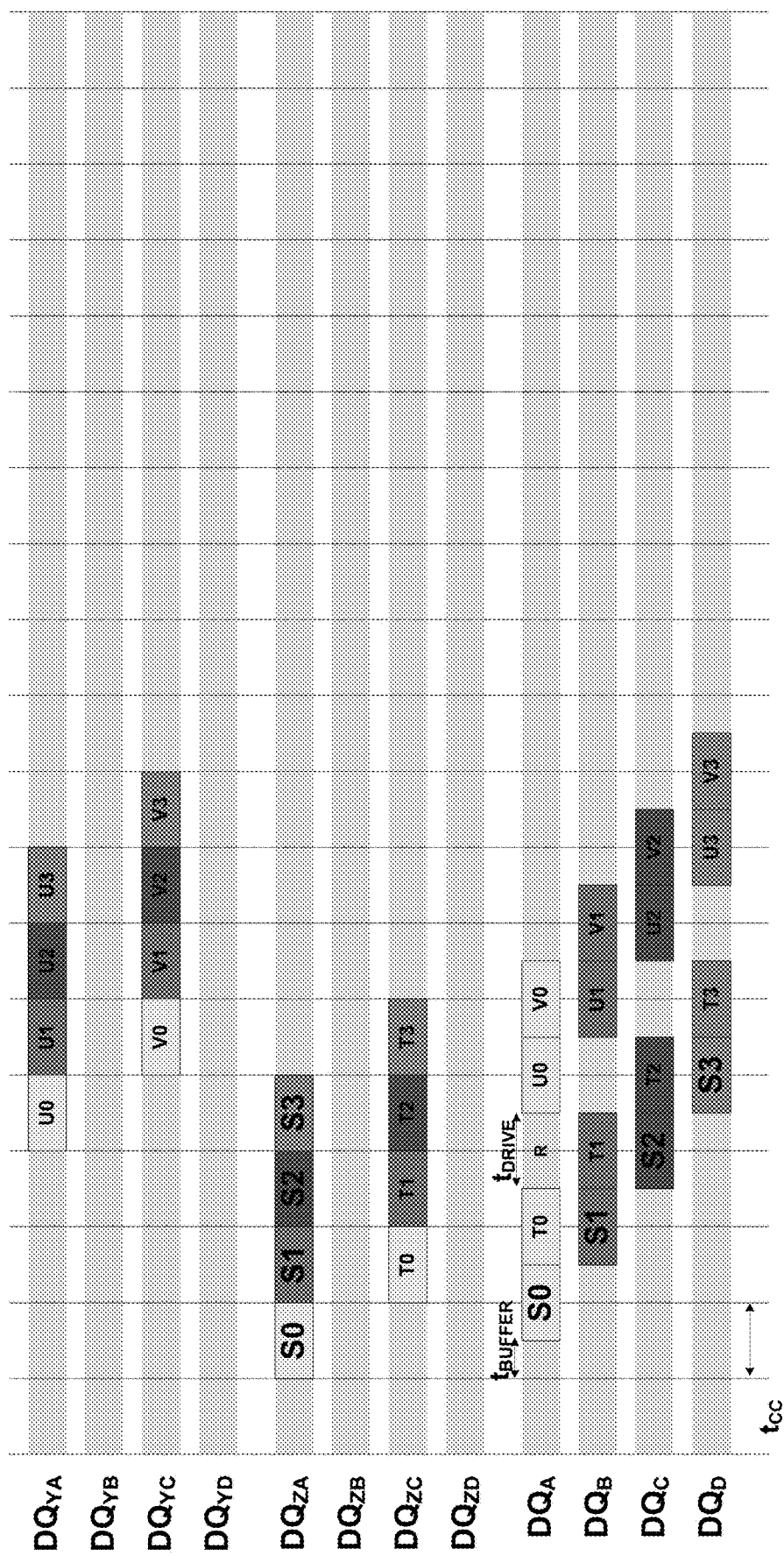
FIG. 9 illustrates a timing diagram of read data transfers carried out by the system of FIG. 8.

FIG. 9 illustrates one embodiment of a timing chart of exemplary read data transfers from the system shown in FIG. 8. The chart is organized such that the first four rows, labeled $DQ_{YA}$-$DQ_{YD}$, represent the timing associated with the secondary busses that interface the memory devices of the second memory module 804 with the buffer circuit of that module. Rows labeled $DQ_{ZA}$-$DQ_{ZD}$ represent the data transfer timing associated with the secondary busses of the first memory module 802. The rows labeled $DQ_A$-$DQ_D$ represent data transfers along the four slices of the primary data bus 808 from the respective buffers to the memory controller 806. The data transfers are responsive to appropriately scheduled read requests transmitted by the controller with appropriate delays to account for the steering and staggering described below. For purposes of clarity, the various threaded read commands are omitted from the timing chart to emphasize the resulting pipeline of data transfers from the memory modules.

Further referring to FIG. 9, and beginning with transactions emanating from the first module 802, a first data transfer is carried out by a first data slice realized by secondary data bus $DQ_{ZA}$, which provides read data from thread $M_{ZA}$ in the form of a serial stream of data bursts S0, S1, S2 and S3. The data bursts involve data transfers for four consecutive time slots associated with the first slice. A second data transfer is carried out by a second thread $M_{ZC}$ with serial data bursts T0-T3 set out along secondary data bus $DQ_{ZC}$. As the buffer circuit receives the first data bursts S0 and T0 from the two threads, they are both sent along a first slice $DQ_A$ of the primary data bus during adjacent $t_{CC}$ intervals after incurring a delay of $t_{BUFFER}$. Concurrent with the transfer of the burst T0, the buffer steering logic directs the second data corresponding to the second burst S1 from the first thread to begin transferring across a second slice $DQ_B$ of the primary data bus. Thus, data S0 and S1, which were accessed from the same data slice along different time slots along a common secondary data path, are transferred along different primary data slices at different time slots. For a given thread, the steering logic sequentially rotates data transmission through a different slice of the primary data bus at each subsequent $t_{CC}$ cycle. This general staggering methodology continues along the remaining primary data bus slices. For switching operations between two modules, staggering can continue for additional threads on another module following a slice-staggered switching delay $t_{DRIVE}$ that allows for switching between the two modules.

As can be seen by the timing chart, the staggering of the data bursts in both space (data bus slices) and time (each burst being offset by a $t_{CC}$ interval) enables a more densely packed pipeline that returns the data to the controller as it is presented to the buffer, thereby minimizing read latency associated with the bursts. This is especially advantageous for data processing systems that employ critical word first caching schemes.

Figure 10:
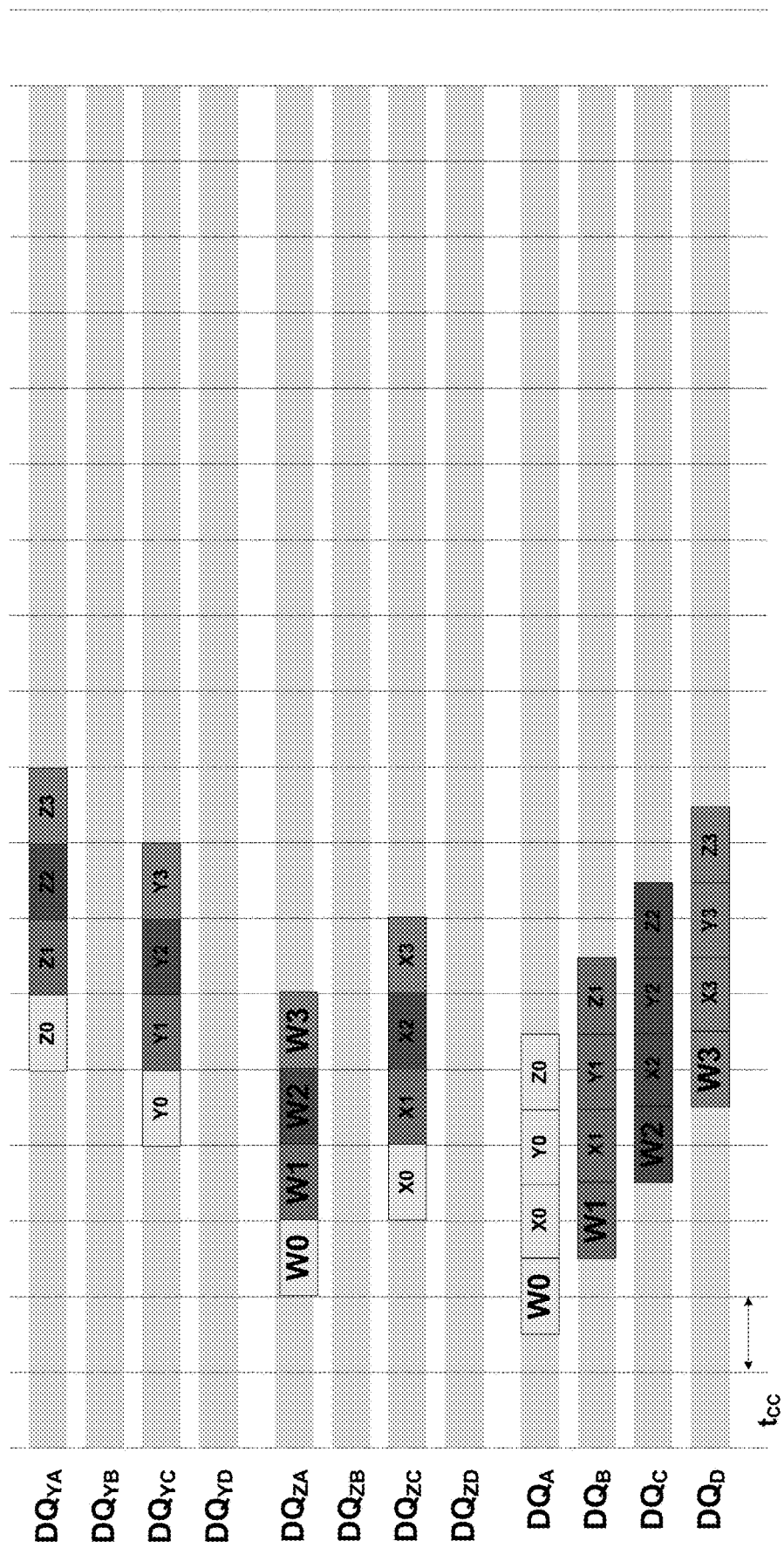
FIG. 10 illustrates a timing diagram of write data transfers carried out by the system of FIG. 8.

FIG. 10 illustrates one embodiment of the timing of exemplary write data transactions carried out by the system of FIG. 8, in a similar but reverse manner to the read transactions of FIG. 9. Write data transferred from the controller is shown as staggered threads of data bursts, where bursts W0-W3 correspond to a first thread for writing to the first module, X0-X3 correspond to a second thread on the first module, and Y0-Y3 and Z0-Z3 corresponding to data threads for writing to the second module. As the bursts come in, they are transferred by the buffer in a serial fashion along the secondary data bus associated with that particular thread.

Figure 11:
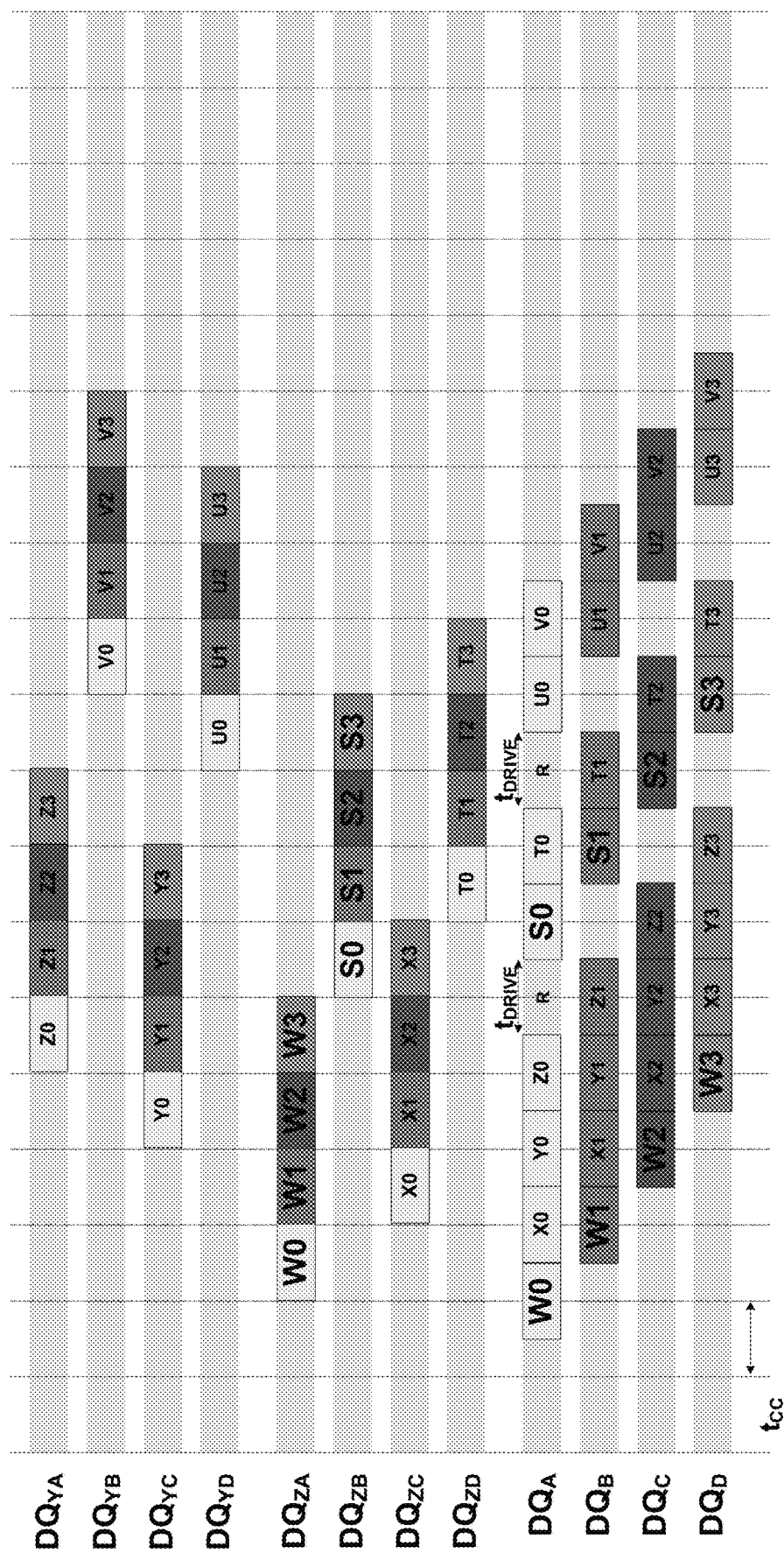
FIG. 11 illustrates a timing diagram of pipelined write-read transactions carried out by the system of FIG. 8.

FIG. 11 illustrates a timing chart similar to FIGS. 9 and 10, but with a series of transactions beginning with a series of write operations followed immediately by read operations. A first series of write data bursts represented by W0-W3 are transferred at different primary bus time slots along different primary data slices $DQ_A$-$DQ_E$ of the primary data bus 808 to a first module 802 from the controller 806. A second sequence of write data bursts represented by X0-X3 are sent along the primary data bus to the same module in adjacent time slots to those occupied by bursts W0-W3. Further sequences of write data bursts represented by Y0-Y3 and Z0-Z3 are handled in a similar manner, but are directed to the second module 804.

As the write data bursts W0-W3 are received at the first module 802 by the buffer 810, they are steered to the same secondary data slice, such as $DQ_{ZA}$, but at different time slots. Following the transfer of the last write data burst W3, a different secondary data slice $DQ_{ZB}$ initiates a read data transfer of a first sequence of read data bursts S0-S3 at different time slots along the same primary bus data slice. Similar operation is associated with bursts X0-X3, with a second sequence of read data bursts T0-T3 sent along a different secondary data slice once the last write data burst is received. As each read data burst is received at the buffer 810, it is steered to a different primary bus data slice at a different time slot in the staggered manner described above. The second module 804 handles its operations in a similar manner.

As is apparent from reviewing the timing chart of FIG. 11, the delays incurred in carrying out write operations followed by read operations are similar to those exhibited by non-threaded modules. As a result, the memory controller 806 need not schedule additional timing constraints in order to schedule the various transactions.

Figure 12:
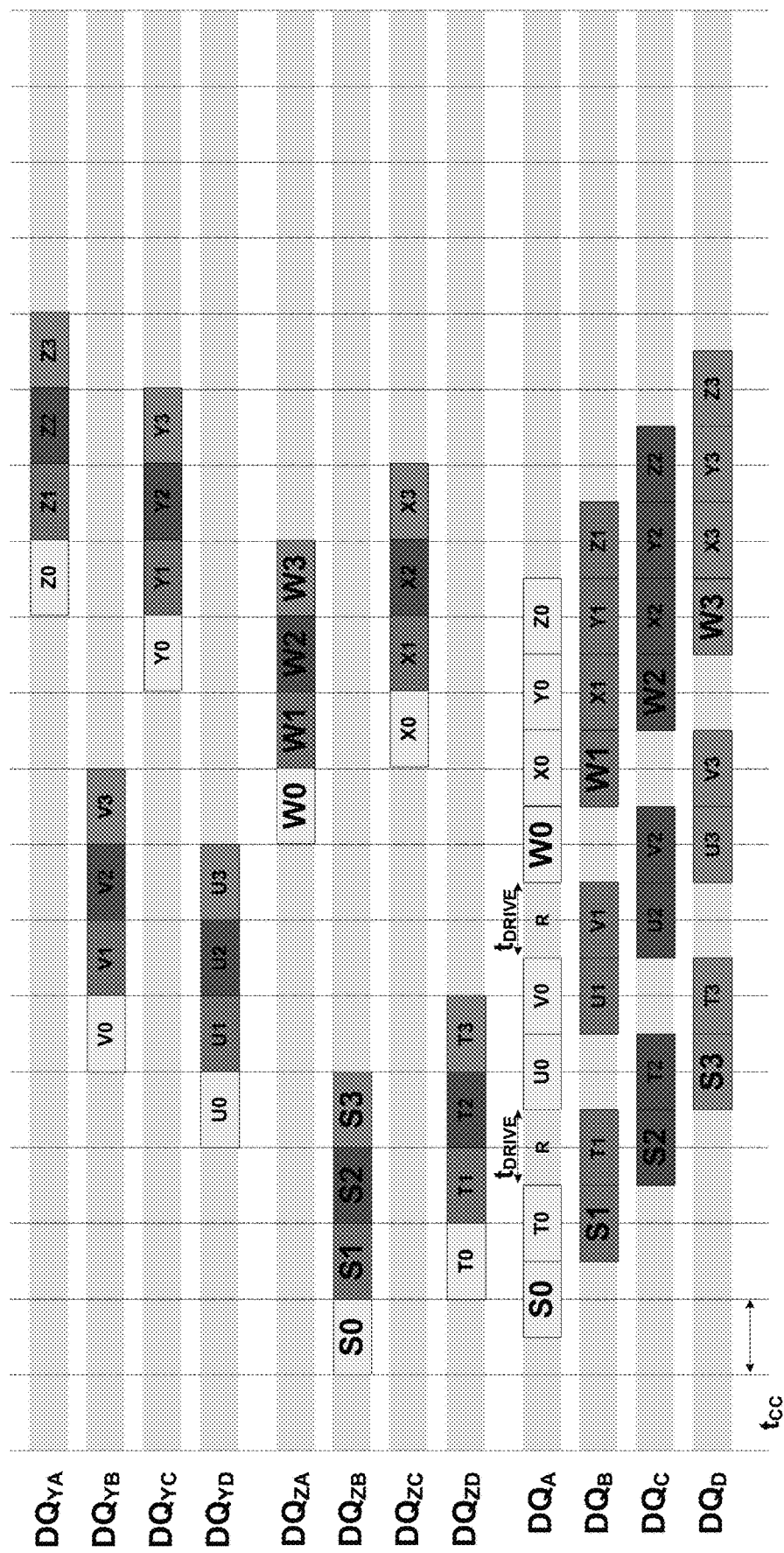
FIG. 12 illustrates a timing diagram of pipelined read-write transactions carried out by the system of FIG. 8.

FIG. 12 illustrates a timing chart similar to FIG. 11, but in the context of a read transaction followed by a write operation. Operation is similar to that described above with respect to FIG. 11, and for purposes of brevity will not be described in further detail.

Those skilled in the art will appreciate the many benefits and advantages afforded by the embodiments presented herein. By implementing transfers of portions of data threads staggered with other portions of other threads, data may be made more readily available for transferring to a memory controller. This reduces the read latency of the read data transfer. For applications that employ critical word first caching methods, this kind of improvement in read latency may provide corresponding boosts in processor performance.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired ing media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, path widths, processing or operating frequencies, component circuits or devices and the like may be different from those described above in alternative embodiments. Also, the interconnection between circuit elements or circuit blocks shown or described as multi-conductor links may alternatively be single-conductor links, and single conductor links may alternatively be multi-conductor links. Links and signaling paths shown or described as being single-ended may also be differential, and vice-versa. Similarly, links described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory module, comprising:
a substrate;
a first group of memory devices disposed on the substrate, the first group of memory devices responsive to a first threaded memory request to transfer a first data thread;
a second group of memory devices disposed on the substrate, the second group of memory devices responsive to a second threaded memory request to transfer a second data thread; and
buffer circuitry disposed on the substrate to receive the first data thread from the first group of memory devices and the second data thread from the second group of memory devices, the buffer circuitry to temporally stagger transmission to a memory controller, along a primary data bus, of a first portion of the first data thread with respect to transmission of a second portion of the first data thread.

2. The memory module according to claim 1, wherein:
the buffer circuitry is to interleave the first portion of the first data thread with a first portion of the second data thread.

3. The memory module according to claim 1, wherein:
the buffer circuitry is to temporally stagger transmission of the first portion of the first data thread with respect to transmission of the second portion of the first data thread in a non-contiguous manner.

4. The memory module according to claim 1, wherein:
each of the first group of memory devices and the second group of memory devices interfaces with the buffer circuitry via a dedicated secondary bus path.

5. The memory module according to claim 1, wherein:
each of the first group of memory devices and the second group of memory devices comprises at least one dynamic random access memory (DRAM) integrated circuit (IC) chip.

6. The memory module according to claim 1, wherein:
the buffer circuitry is to transmit the first data thread and the second data thread in accordance with a critical word first policy.

7. The memory module according to claim 1, wherein:
the first portion of the first data thread comprises a first data burst of the first data thread; and
the second portion of the first data thread comprises a second data burst of the first data thread.

8. A memory, comprising:
at least one memory module for coupling to a memory controller via a primary data bus;
wherein the at least one memory module includes
  a substrate;
  multiple memory devices disposed on the substrate, the multiple memory devices partitioned into separately accessible groups of memory devices, the separately accessible groups of memory devices being responsive to respective threaded memory requests to transfer at least a first data thread from a first one of the separately accessible groups of memory devices and a second data thread from a second one of the separately accessible groups of memory devices; and
  buffer circuitry disposed on the substrate to receive the first data thread and the second data thread, the buffer circuitry to stagger transmission, in time, to the memory controller, of a first data burst of the first data thread with respect to transmission of a second data burst of the first data thread.

9. The memory according to claim 8, wherein:
the buffer circuitry includes a primary interface to couple to the memory controller via the primary data bus in a multi-drop configuration.

10. The memory according to claim 8, wherein:
the buffer circuitry includes a primary interface to couple to the memory controller in a point-to-point configuration.

11. The memory according to claim 8, wherein:
the at least one memory module includes
  a first memory module partitioned to transfer the first and second data threads, and
  a second memory module partitioned to transfer third and fourth data threads.

12. The memory module according to claim 11, wherein:
at least one data burst from each of the first, second, third and fourth data threads are transferred across the entire primary data bus width during respective time intervals, and collectively interleaved together, such that data bursts from each data thread are transmitted in a temporally non-contiguous manner.

13. The memory module according to claim 8, wherein:
the buffer circuitry of the at least one memory module is to interleave the first data burst of the first data thread with a first data burst of the second data thread.

14. The memory module according to claim 8, wherein:
the buffer circuitry of the at least one memory module is to transmit the first data thread and the second data thread in accordance with a critical word first policy.

15. The memory according to claim 8, wherein:
each of the first group of memory devices and the second group of memory devices of the at least one memory module comprises at least one dynamic random access memory (DRAM) integrated circuit (IC) chip.

16. A method of operating a memory module having a substrate, buffer circuitry disposed on the substrate for coupling to a primary data bus, the method comprising:
receiving, with the buffer circuitry, a first threaded memory request to transfer a first data thread from a first group of memory devices;
receiving, with the buffer circuitry, a second threaded memory request to transfer a second data thread from a second group of memory devices;
temporally staggering transfer of a first portion of the first data thread across the primary data bus with respect to transfer of a second portion of the first data thread.

17. The method according to claim 16, wherein the temporally staggering transfer further comprises:
interleaving the first portion of the first data thread with a first portion of the second data thread.

18. The method according to claim 16, wherein the temporally staggering transfer further comprises:
transmitting the first data thread and the second data thread in accordance with a critical word first policy.

19. The method according to claim 16, wherein the temporally staggering transfer further comprises:
transmitting along a dedicated portion of the primary data bus in a point-to-point configuration.

20. The method according to claim 16, wherein the temporally staggering transfer further comprises:
transmitting along a full width of the primary data bus in a multi-drop configuration.

* * * * *